United States Patent [19]
Feldt et al.

[11] Patent Number: 5,646,576
[45] Date of Patent: Jul. 8, 1997

[54] OUTPUT STAGE OF OPERATIONAL AMPLIFIER SUITABLE FOR MOUNTING ON A SUBSTRATE AND METHOD OF AMPLIFYING THEREWITH

[75] Inventors: Daniel Charles Feldt, Streamwood, Ill.; William David Anderson, Chapel Hill, N.C.

[73] Assignee: Motorola, Schaumburg, Ill.

[21] Appl. No.: 506,158

[22] Filed: Jul. 24, 1995

[51] Int. Cl.[6] ........................................ H03F 3/30
[52] U.S. Cl. .............................. 330/263; 330/267; 330/295
[58] Field of Search ................................. 330/263, 267, 330/273, 295

[56] References Cited

U.S. PATENT DOCUMENTS

| | | | |
|---|---|---|---|
| 3,471,795 | 10/1969 | Schilling | 330/299 |
| 3,579,136 | 5/1971 | Machamer | 330/296 |
| 4,240,040 | 12/1980 | Saari | 330/267 X |
| 4,524,328 | 6/1985 | Abou et al. . | |
| 4,532,479 | 7/1985 | Blauschild . | |
| 4,588,961 | 5/1986 | Rao | 330/267 |
| 4,636,744 | 1/1987 | King et al. | 330/255 X |
| 4,755,767 | 7/1988 | Yamatake . | |
| 5,140,280 | 8/1992 | Vyne et al. . | |
| 5,194,824 | 3/1993 | Wu et al. . | |
| 5,399,991 | 3/1995 | Moraveji . | |

OTHER PUBLICATIONS

Search Report under Section 17 for UK Application No. GB 9615220.2, Date searched: 14 Aug. 1996.
Electronic Design, May 16, 1994, "Rail–To–Rail In–And––Out IC OP Amps Run Off 2.7 V".
Motorola Linear–Interface ICs Databook, "MC33171, MC33172, MC33174, MC35171, MC35172, MC35174", Q3–93.
Texas Instruments Databook, "TLC2272, TLC2272A, TLC2272Y Advanced Lin CM05 Dual Rail-to-Rail Operational Amplifiers".

*Primary Examiner*—James B. Mullins
*Attorney, Agent, or Firm*—Randall S. Vaas

[57] ABSTRACT

An output stage (418) for an operational amplifier (403) powered by a first supply voltage rail (102) and a second supply voltage rail (104) includes a buffer (100) and a current booster (500) for amplifying an input voltage (105) into a low impedance output signal (117 and 520). The buffer (100) amplifies the input voltage (105) into the amplified output signal (117 and 520) when the input voltage (105) is within a buffer voltage range (210), the buffer voltage range (210) contained within a maximum voltage range (208) defined by a voltage difference in the first supply voltage rail (102) and the second supply voltage rail (104). The current booster (500) assists the buffer (100) in amplifying the input voltage (105) into the output signal (117 and 520) when the input voltage (105) is outside of the buffer voltage range (210) but within the maximum voltage range (208).

24 Claims, 5 Drawing Sheets

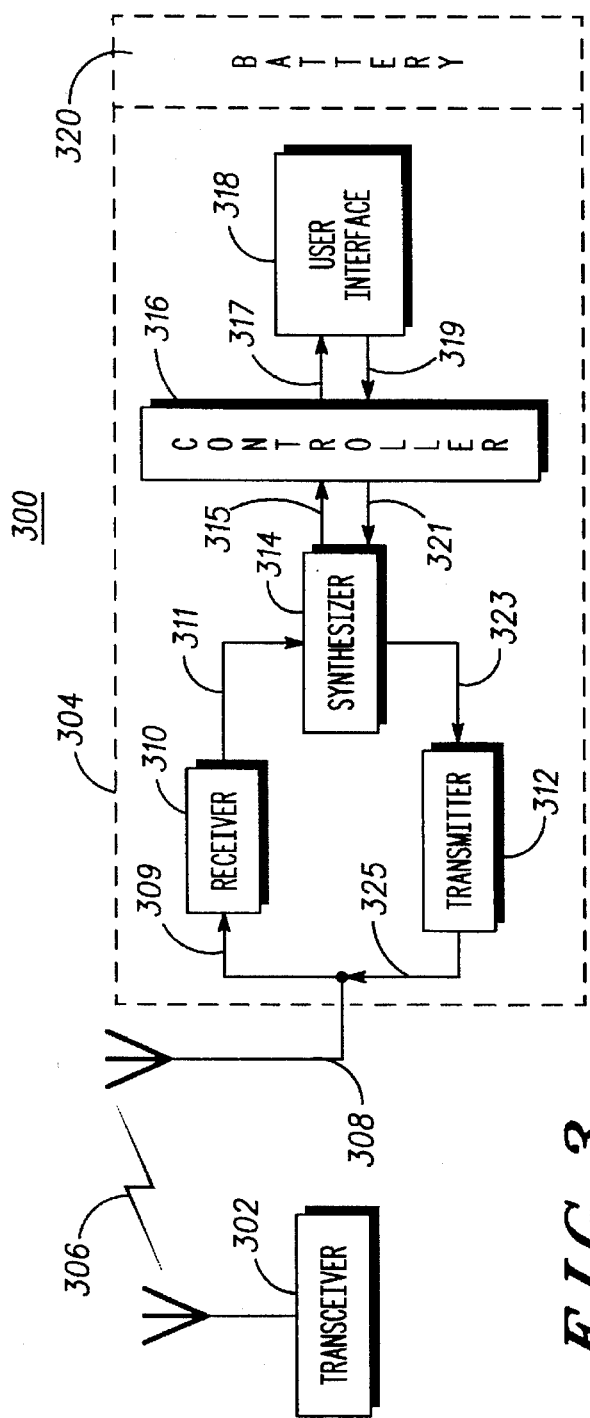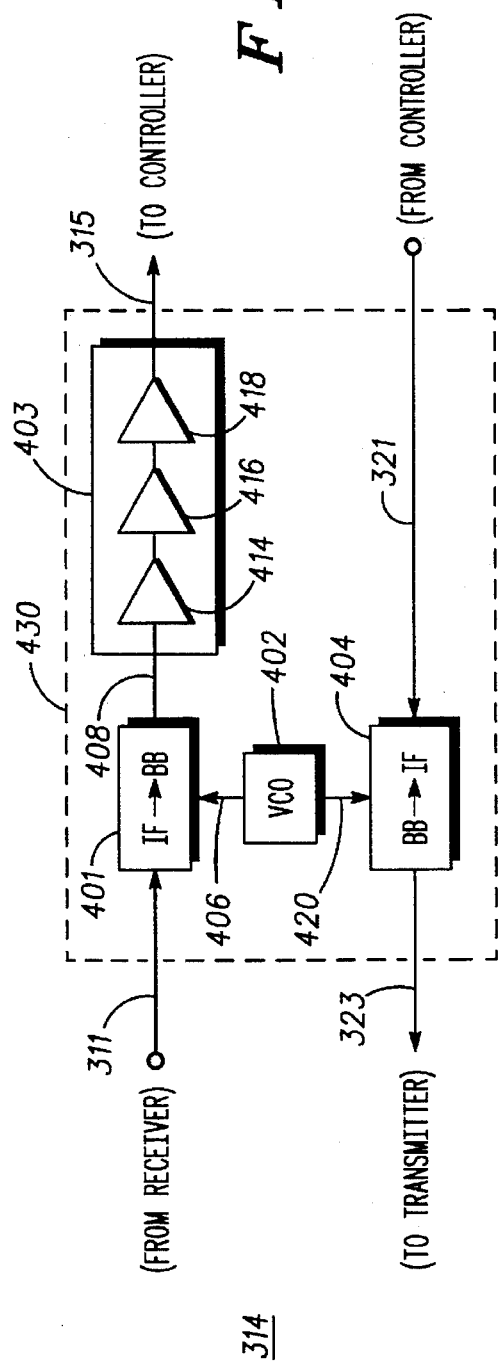

5,646,576

OUTPUT STAGE OF OPERATIONAL AMPLIFIER SUITABLE FOR MOUNTING ON A SUBSTRATE AND METHOD OF AMPLIFYING THEREWITH

BACKGROUND OF THE INVENTION

1. Field of the Invention

The present invention relates generally to amplifiers and more specifically to output stages of operational amplifiers.

2. Description of the Related Art

Generally, an operational amplifier (op amp) is used in many applications which include, but are not limited to, radiotelephones. In fact, current radiotelephones include multiple op amps for increasing signal power in both the receiver and the transmitter. Such op amps are typically mounted, along with other circuitry, on a substrate of an integrated circuit (IC). As radiotelephones become smaller and more portable, there is a growing need for the op amps to operate effectively at low power supply voltages.

Op amps consist of an input stage, an intermediate stage, and an output stage. When the op amp is mounted on an IC at a signal output thereof, it is necessary for the output stage of the op amp to provide a low impedance output. The low impedance output prevents the remainder of the circuit mounted on the IC from becoming unstable from large amounts of capacitance provided by other directly coupled ICs or other components. Unfortunately, many of the existing op amp output stages, including those with the capability of swinging rail-to-rail, exhibit a high output impedance.

FIG. 1 is an illustration in schematic form of a known low impedance output stage for an op amp comprising an emitter (or source) follower buffer 100. The buffer 100 is powered by a first supply voltage rail (+$V_{BB}$) 102 and a second supply voltage rail 104. The buffer 100 includes an input 106 for receiving an input voltage 105. The input 106 is coupled to first and second buffering devices 108, 110 via respective first and second biasing devices 112, 114. In response to the input voltage 105, the first and second buffering devices 108, 110 provide an output voltage 115 and an output current 117, collectively an output signal, at an output 116 coupled thereto. The output signal is capable of driving a load, such as another IC, (not shown) that is coupled to the output 116 and similarly powered by the first and second supply voltage rails 102, 104.

FIG. 2 is an illustration in graph form of a known voltage transfer characteristic 200 of the buffer 100 of FIG. 1. In response to the input voltage 105, the first and second buffering devices 108, 110 alternate operation to provide the output signal. As the input voltage 105 exceeds +$V_{BB}$/2, as designated by portion 202 of the transfer characteristic 200, the output current 117 is primarily sourced to the output 116 of FIG. 1 by the first buffering device 108. As the input voltage 105 falls below +$V_{BB}$/2, as designated by portion 204 of the transfer characteristic 200, the output current 117 is primarily sunk from the output 116 by the second buffering device 110. The first and second biasing devices 112, 114 ensure that the first and second buffering devices 108, 110, respectively, remain on to prevent crossover distortion as the input voltage 105 approximately equals, or passes through, +$V_{BB}$/2, as designated by point 206 on the transfer characteristic 200.

Due to base-emitter junction electrical limitations of the bipolar junction transistors comprising the first and second biasing devices 108, 110, the buffer 100 is unable to provide the output signal and drive the load over a maximum voltage range 208. The maximum voltage range 208 is defined by the difference between the first and second supply voltage rails 102, 104 and designated as 0 V to +$V_{BB}$. In fact, the buffer 100 is unable to provide the output signal when the input voltage 105 is within a diode drop of either the first or second supply voltage rail 102, 104. A diode drop is commonly known as the voltage drop between the base and the emitter of a bipolar junction transistor. Therefore, the buffer 100 is effectively limited to operation in a buffer voltage range 210 defined by the difference in the first supply voltage rail 102 less a diode drop and the second supply voltage rail 104 plus a diode drop. Assuming that the diode drop is approximately 0.8 V, the buffer voltage range 210 extends from approximately 0.8 V to approximately +VBB–0.8 V as depicted in FIG. 2.

In low power applications, the loss of operating range, or lack of ability to swing rail-to-rail, due to the two diode drops creates a substantial limitation. For example, if the first supply voltage rail 102 is 3 V and the second supply voltage rail 104 is 0 V as shown, the maximum voltage range 208 becomes 3 V and the buffer voltage range 210 becomes approximately 1.4 V. In such a scenario, the buffer 100 would be incapable of providing the output signal and driving the load for more than half (approximately 1.6 V) of the 3 V maximum voltage range 208.

Therefore, what is needed is an output stage for an op amp having rail-to-rail swing capability so as to be suitable for use in a low voltage application and having a low output impedance so as to be suitable for mounting at the output of an IC.

BRIEF DESCRIPTION OF THE DRAWINGS

FIG. 3 is an illustration in block diagram form of a radio frequency communications system employing a radiotelephone;

FIG. 4 is an illustration in block diagram form, with limited detail, of a synthesizer of the radiotelephone of FIG. 3, the synthesizer employing an operational amplifier;

DETAILED DESCRIPTION OF THE PREFERRED EMBODIMENTS

Figure 1:
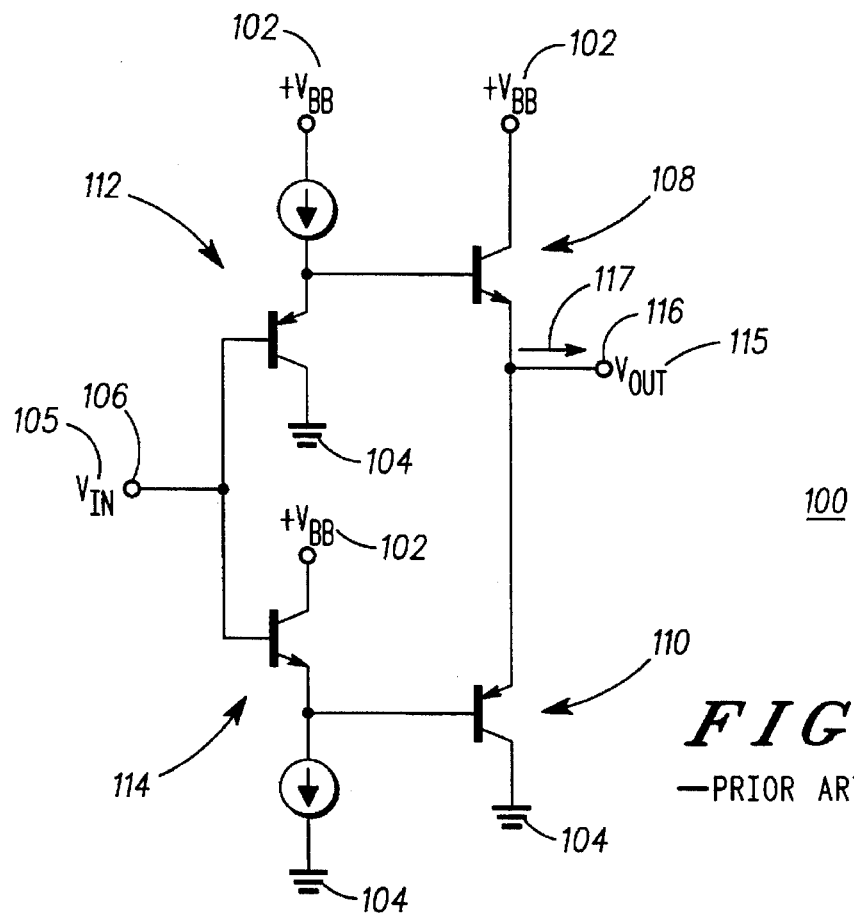
FIG. 1 is an illustration in schematic form of a known output stage of an operational amplifier.

An output stage for an operational amplifier powered by a first supply voltage rail and a second supply voltage rail includes a buffer and a current booster for amplifying an input voltage into a low impedance output signal. The buffer amplifies the input voltage into the amplified output signal when the input voltage is within a buffer voltage range, the buffer voltage range contained within a maximum voltage range defined by a voltage difference between the first supply voltage rail and the second supply voltage rail. The current booster assists the buffer in amplifying the input voltage into the amplified output signal when the input voltage is outside of the buffer voltage range but within the maximum voltage range.

FIG. 3 is an illustration in block diagram form of a radio frequency communications system 300 wherein a transceiver 302 and a radiotelephone 304 communicate via radio frequency (RF) signals 306. The transceiver 302 is a fixed site transceiver serving a radio coverage area populated by radiotelephones, such as radiotelephone 304. The radiotelephone 304 includes an antenna 308, a receiver 310, a transmitter 312, a synthesizer 314, a controller 316, and a user interface 318. The radiotelephone 304 operates via power provided by a detachable battery 320. The transceiver 302 transmits RF signals 306 into its radio coverage area populated by the radiotelephone 304. The antenna 308 transduces the RF signals 306 into electrical RF receive signals 309 and couples the electrical RF receive signals 309 to the receiver 310. The receiver 310 mixes the electrical RF receive signals 309 with a local oscillator frequency to generate intermediate frequency (IF) receive signals 311. The receiver 310 couples the IF receive signals 311 to the synthesizer 314. The synthesizer 314 provides additional mixing frequencies for converting the IF receive signals 311 into baseband (BB) receive signals 315. The synthesizer 314 adjusts and maintains the BB receive signals 315 at a desired amplitude for use by the controller 316. The controller 316 processes BB receive signals 315 into data receive signals 317. The data receive signals are coupled to the user interface 318 and output to the user as audible speech via a speaker (not shown) and as operational information via a visual display device (not shown).

Speech input by the user via a microphone (not shown) of the user interface 318 is transduced and coupled to the controller 316 as data transmit signals 319. The controller 316 converts the data transmit signals 319 into BB transmit signals 321. The BB transmit signals 321 are coupled to the synthesizer 314. The synthesizer converts the BB transmit signals 321 into IF transmit signals 323. The IF transmit signals 323 are coupled to the transmitter 312, which mixes the IF transmit signals 323 with a local oscillator frequency to convert the IF transmit signals 323 into electrical RF transmit signals 325. The electrical RF transmit signals 325 are further transduced by the antenna 308 and transmitted to the transceiver 302 as RF signals 306.

FIG. 4 is an illustration in block diagram form of the synthesizer 314 of the radiotelephone 304. The synthesizer 314 includes a downconverter 401, a voltage controlled oscillator (VCO) 402, an op amp 403, and an upconverter 404. The IF receive signals 311 generated by the receiver 310 of FIG. 3 are coupled to the downconverter 401. The downconverter 401 performs quadrature demodulation on the IF receive signals 311 by mixing the IF receive signals 311 with inphase and quadrature components of an intermediate frequency signal 406 input to the downconverter 401 from the VCO 402. The resulting inphase and quadrature receive signals are filtered by the downconverter 401 and coupled to the op amp 403 as intermediate BB receive signals 408. The op amp 403 adjusts the intermediate BB receive signals 408 to a desired amplitude and outputs the intermediate BB receive signals 408 to the controller 316 of FIG. 3 as BB receive signals 315. The op amp 403 includes an input stage 414, an intermediate stage 416, and an output stage 418.

The BB transmit signals 321 generated by the controller 316 of FIG. 3 are coupled to the upconverter 404. The upconverter 404 mixes the transmit BB signals with inphase and quadrature components of an IF frequency signal 420 generated by the VCO 402. The mixed inphase and quadrature IF signals are combined and output from the upconverter 404 as IF transmit signals 323. The IF transmit signals 323 are further coupled to the transmitter 312 of FIG. 3.

In the preferred embodiment, the components of the synthesizer 314 shown in FIG. 4 are integrated and bonded to a suitable substrate 430, such as a ceramic substrate. The substrate 430 is mounted into an IC package (not shown). The IC package provides pinouts for connecting components of the synthesizer 314, such as the output stage 418 of the op amp 403, to external components, such as the controller 316 of FIG. 3 which may consist of one or more IC packages. When coupling the BB receive signal 315 from an output of the IC package of the synthesizer 314 directly to an input of the IC package of the controller 316, the BB receive signal 315 encounters a large amount of capacitance from the input of the IC package of the controller 316. In order to prevent the synthesizer 314 from becoming unstable from this high capacitance, it is necessary for the output stage 418 to provide a low impedance output.

Figure 5:
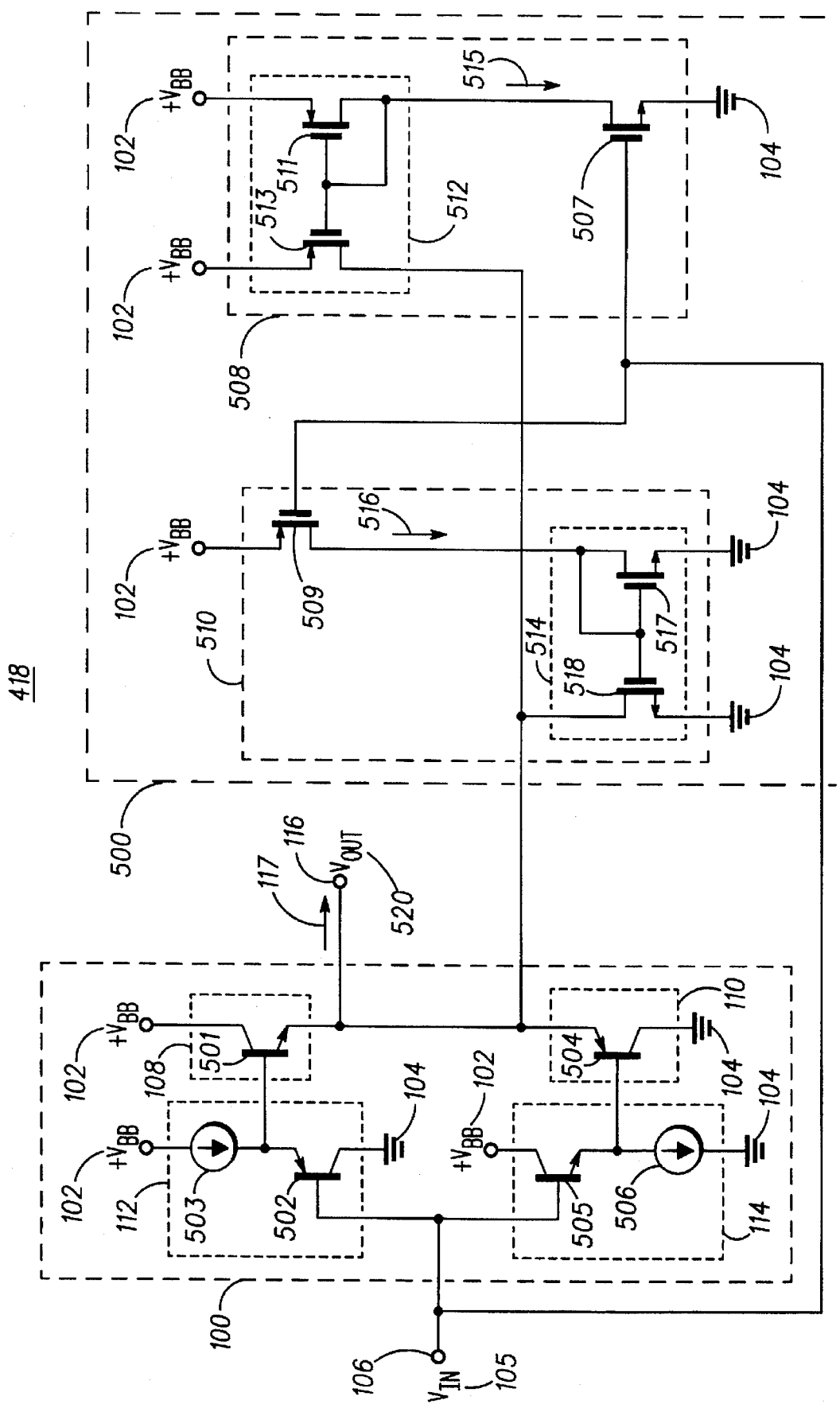
FIG. 5 is an illustration in schematic form of an output stage of the operational amplifier of FIG. 4.

FIG. 5 is an illustration in schematic form of the output stage 418 of the op amp 403 of FIG. 4. In the preferred embodiment, the output stage 418 is unity gain and includes the buffer 100 of FIG. 1 and the current booster 500. The buffer 100, which is a push-pull circuit, is powered by the first and second supply voltage rails 102, 104 of the battery 320 of FIG. 3. Although the second supply voltage rail 104 is shown as ground, it will be recognized that the output stage 418 could be powered via a split supply having positive and negative supply voltage rails wherein the first supply voltage rail 102 remains $+V_{BB}$ and the second supply voltage rail 104 is designated, for example, $-V_{BB}$.

The buffer 100 is coupled between the input 106 and the output 116 of the output stage 418 and includes the first and second buffering devices 108, 110 and the first and second biasing devices 112, 114 generally described with respect to FIG. 1. More specifically, the first buffering device 108 includes npn transistor 501 having a base, a collector coupled to the first supply voltage rail 102, and an emitter coupled to the output 116. The first buffering device 108 is biased to a diode drop above the input voltage 105 by the first biasing device 112. The first biasing device 112 includes pnp transistor 502 having a base coupled to the input 106, a collector coupled to the second supply voltage rail 104, and an emitter coupled to the base of npn transistor 501 of the first buffering device 108, a first current source 503, and the first supply voltage rail 102. In the preferred embodiment, the first current source 503 could be implemented by a PMOS transistor.

The second buffering device 110 includes pnp transistor 504 having a base, a collector coupled to the second supply voltage rail 104, and an emitter coupled to both the output 116 and the emitter of npn transistor 501 of the first buffering device 108. The second buffering device 110 is biased to a diode drop below the input voltage 105 by the second biasing device 114. The second biasing device 114 includes npn transistor 505 having a base coupled to the input 106, a collector coupled to the first supply voltage rail 102, and an emitter coupled to the base of pnp transistor 504 of the second buffering device 110, a second current source 506, and the second supply voltage rail 104. In the preferred embodiment, the second current source 506 could be implemented by a NMOS transistor.

Figure 2:
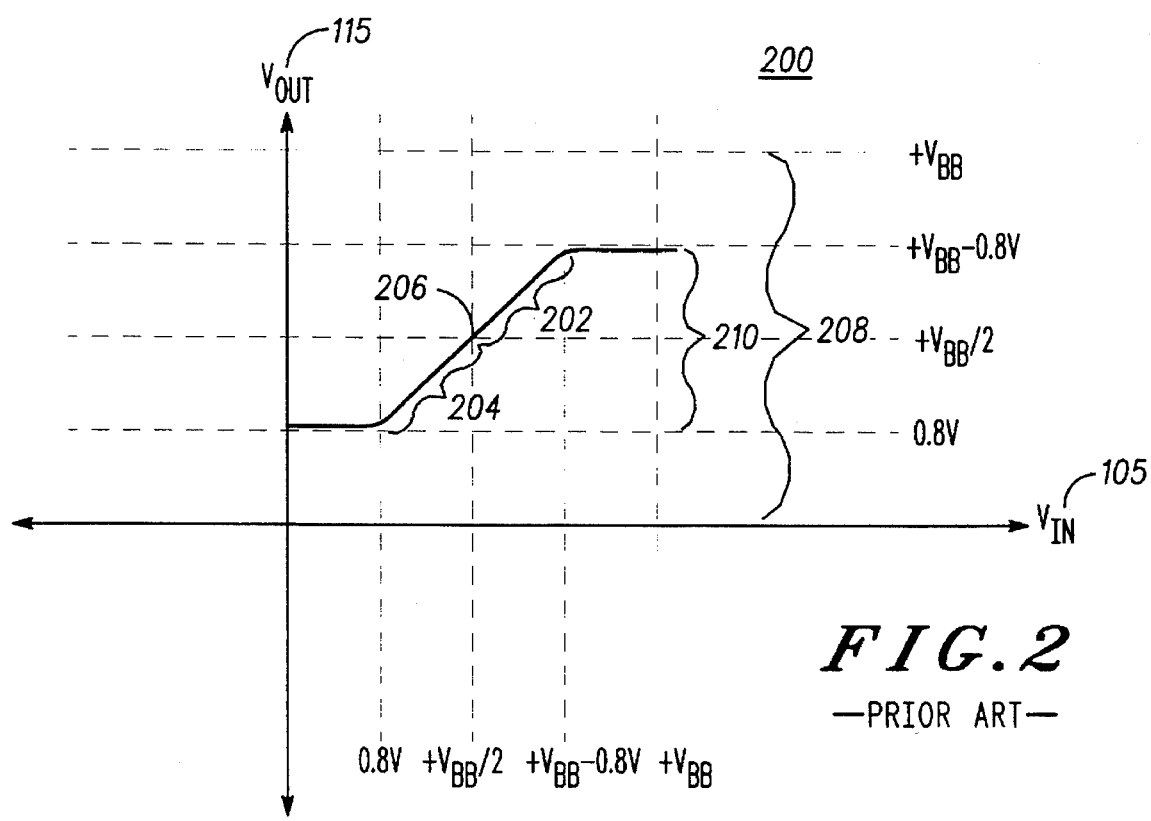
FIG. 2 is an illustration in graph form of a known voltage transfer characteristic of the output stage of FIG. 1.

The buffer 100 operates in response to the input voltage 105 applied at the input 106 as previously described with respect to FIGS. 1 and 2. The first and second buffering devices 108, 110 alternate operation based on a magnitude of the input voltage 105 to provide the output signal capable of driving a load, such as the controller 316 of FIG. 3. However, as previously stated, the buffer 100, which realizes base-emitter junction voltage limitations, is incapable of swinging rail-to-rail and providing the output signal when the input voltage 105 is outside of the buffer voltage range 210 of FIG. 2 (when the input voltage 105 comes within approximately 0.8 V of either the first supply voltage rail 102 or the second supply voltage rail 104). In order to provide rail-to-rail swing capability so that the output signal can be generated when the input voltage 105 is outside of the buffer voltage range 210 of FIG. 2, the current booster 500 is coupled to the buffer 100.

The current booster 500, which is powered by the first and second supply voltage rails 102, 104 and coupled between the input 106 and the output 116 of the output stage 418, assists the buffer 100 in providing an output voltage 520 and the output current 117, collectively the output signal, at the output 116 when the input voltage 105 is outside of the buffer voltage range 210 of FIG. 2. The current booster 500 permits the output stage 418 to operate over approximately the maximum voltage range 208 of FIG. 2 and still provide low impedance at the output 116.

The current booster 500, which is a rail-to rail swing circuit, includes a first booster device 508 and a second booster device 510. The first booster device 508 includes NMOS transistor 507 having a gate coupled to the input 106, a source coupled to the second supply voltage rail 104, and a drain coupled to the output 116. The first booster device 508 further includes a first current mirror 512. In the preferred embodiment, the first current mirror 512 comprises PMOS transistors 511 and 513. The first current mirror 512 is coupled between the drain of NMOS transistor 507 of the first booster device 508 and the output 116. The second booster device 510 includes PMOS transistor 509 having a gate coupled to the input 106, a source coupled to the first supply voltage rail 102, and a drain coupled to the output 116. The second booster device 510 further includes a second current mirror 514. In the preferred embodiment, the second current mirror 514 comprises NMOS transistors 517 and 518. The second current mirror 514 is coupled between the drain of PMOS transistor 509 of the second booster device 510 and the output 116.

The current booster 500 operates as follows. As the input voltage 105 approaches the first supply voltage rail 102, the first booster device 508 turns on and causes a first booster current 515 to flow into the drain of NMOS transistor 507 of the first booster device 508. The first booster current 515 is mirrored or inverted by the first current mirror 512 and coupled to the output 116. As the input voltage approaches the second supply voltage rail 104, the second booster device 510 turns on and causes a second booster current 516 to flow out of the drain of PMOS transistor 509 of the second booster device 510. The second booster current 516 is mirrored or inverted by the second current mirror 514 and coupled to the output 116.

Figure 6:
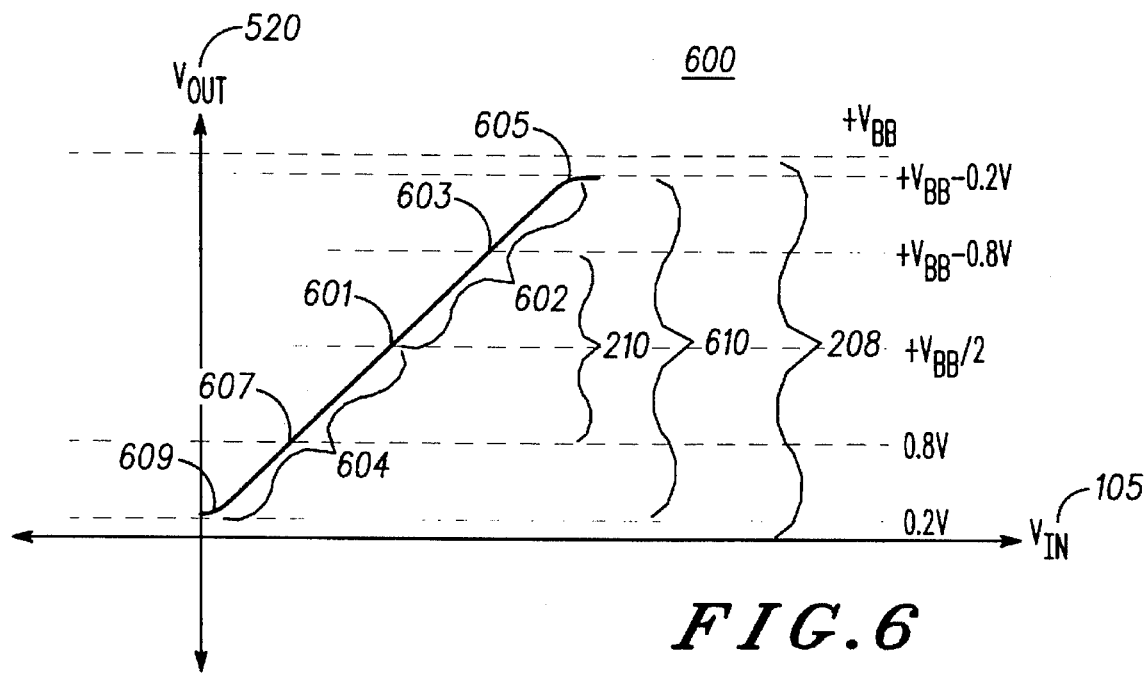
FIG. 6 is an illustration in graph form of a voltage transfer characteristic of the output stage of FIG. 5.

FIG. 6 is an illustration in graph form of a voltage transfer characteristic 600 of the output stage 418 of FIGS. 4 and 5. In response to the input voltage 105, the first and second buffering devices 108, 110 and the first and second booster devices 508, 510 alternate operation to provide the output voltage 520 and the output current 117. As the input voltage exceeds $+V_{BB}/2$ and approaches $+V_{BB}$, as designated by portion 602 of the transfer characteristic 600, the output voltage 520 is generally provided by the first and second buffering devices 108, 110 and the first booster device 508. Specifically, the first buffering device 108 primarily provides the output voltage 520 and the output current 117 for values of the input voltage 105 between point 601 on the transfer characteristic 600 (or approximately $+V_{BB}/2$) and point 603 (or approximately $+V_{BB}-0.8$ V). Between point 603 and point 605 (or approximately $+V_{BB}-0.2$ V), the output voltage 520 is provided by the second buffering device 110 and the output current 117 is provided by the first booster device 508.

For input voltages below $+V_{BB}/2$ and approaching 0 V, as designated by portion 604 of the transfer characteristic 600, the output voltage 520 and the output current 117 are generally provided by the first and second buffering devices 108, 110 and the second booster device 510. Specifically, the second buffering device 110 primarily provides the output voltage 520 and the output current 117 for values of the input voltage 105 between point 601 (or approximately $+V_BB/2$) and point 607 (or approximately 0.8 V). Between point 607 and point 609 (or approximately 0.2 V), the output voltage 520 is provided by the first buffering device 108 and the output current 117 is provided by the second booster device 510. Because the first and second biasing devices 112, 114 ensure that at least one of npn transistor 501 and pnp transistor 504 of the first and second buffering devices 108, 110, respectively, remains continuously on, the impedance at the output 116 remains low.

Unlike the known output stage of FIG. 1 comprising only the buffer 100, here, the output stage 418 exhibits rail-to-rail swing capability and increased operating range; that is, the output stage 418 produces the output voltage 520 and the output current 117 when the input voltage 105 falls both within the buffer voltage range 210 and outside the buffer voltage range 210 but at least approximately 0.2 V away from either the first or second supply voltage rail 102, 104. In the preferred embodiment, the first supply voltage rail 102 is 3 V and the second supply voltage rail 104 is ground or 0 V as shown defining the maximum voltage range 208 as 3 V. In comparison to the known buffer 100, which is limited to operation in the buffer voltage range 210 that encompasses only 1.4 V of a possible 3 V, the buffer 100 plus the current booster 500 are capable of providing the output voltage 520 and the output current 117 over a boosted voltage range 610 that encompasses 2.6 V of the possible 3 V. The boosted voltage range 610 is depicted in FIG. 6 as extending between approximately 0.2 V and approximately $V_{BB}-0.2$ V.

Figure 7:
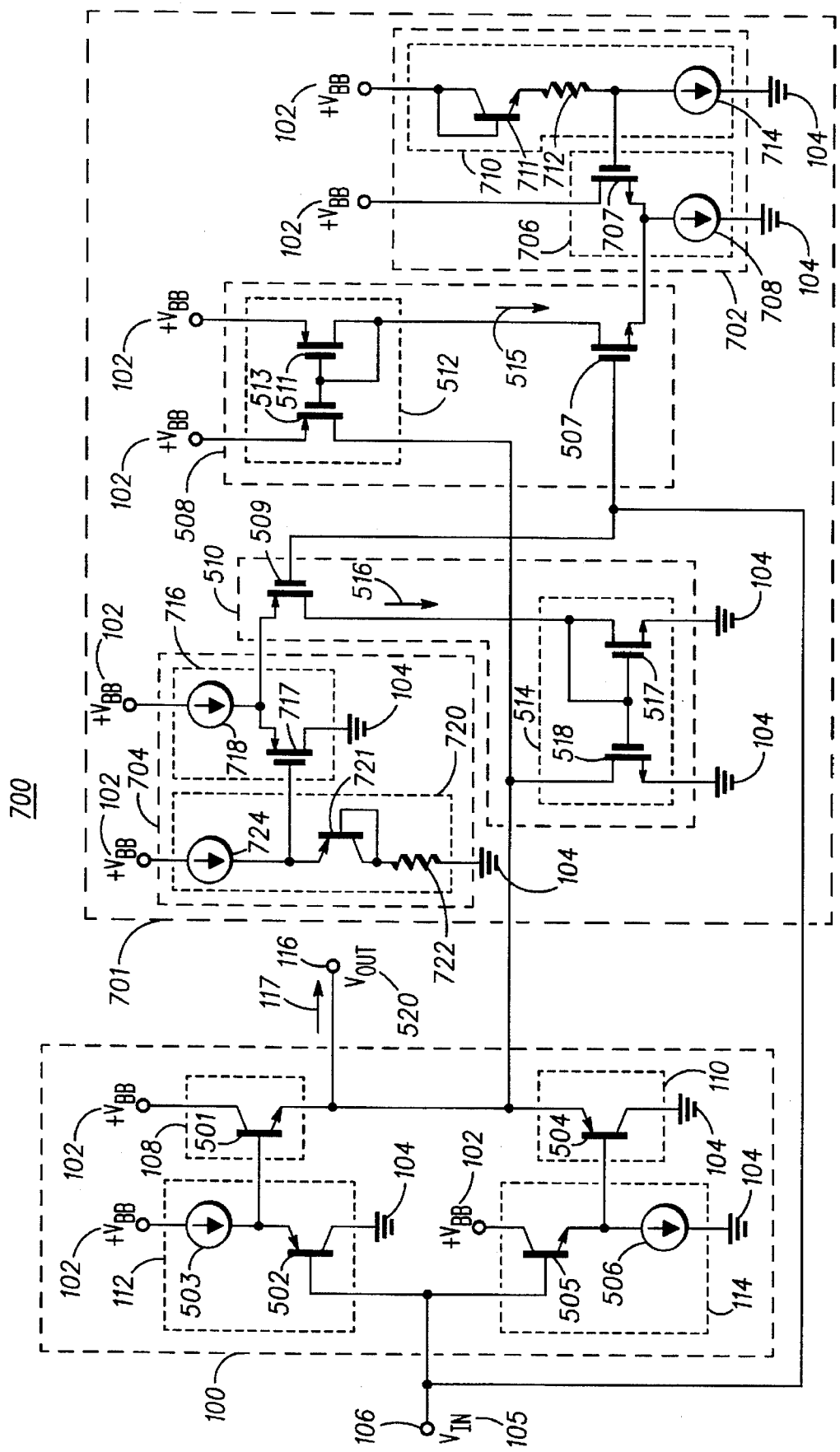
FIG. 7 is an illustration in schematic form of an alternate output stage of the operational amplifier of FIG. 4.

FIG. 7 is an illustration in schematic form of an alternate output stage 700 for the op amp 403 of FIG. 4. The alternate output stage 700 is substantially identical to the output stage 418 illustrated in FIG. 5 except that it provides a switch for "turning on and off" the first and second booster devices 508, 510 so as to prevent unnecessary current drain when the first and second booster devices 508, 510 are not in use. The first and second booster devices 508, 510 need not provide the first and second booster currents 515, 516 to assist the first and second buffering devices 108, 110 at least until the input voltage 105 approaches the upper limit $+V_{BB}-0.8$ V or the lower limit 0.8 V of the buffer voltage range 210 (see FIG. 6). To realize current savings by not operating the first and second booster devices 508, 510 within the buffer voltage range 210, an alternate current booster 701 includes a first switch 702 and a second switch 704 coupled to the first and second booster devices 508, 510, respectively.

The first switch 702 includes a first switching device 706. The first switching device 706 includes NMOS transistor 707 coupled to the first booster device 508 in a differential pair configuration. NMOS transistor 707 of the first switching device 706 includes a gate, a drain coupled to the first supply voltage rail 102, and a source coupled to the source of NMOS transistor 507 of the first booster device 508. The first switching device 706 includes a third current source 708 coupled to the sources of NMOS transistors 507, 707 of the first booster device 508 and the first switching device 706, respectively, for biasing the differential pair configuration. The third current source 708 could be implemented by a NMOS transistor.

The first switch 702 includes a first switch biasing device 710 coupled to the first switching device 706. The first switch biasing device 710 includes npn transistor 711 having a base, a collector coupled to the first supply voltage rail 102, and an emitter. The base is coupled to the collector to realize a diode drop across npn transistor 711. The first switch biasing device 710 includes a first resistor 712 coupled between the emitter of npn transistor 711 and the gate of NMOS transistor 707 of the first switching device 706. The first resistor 712 is valued to provide approximately one-half of a diode drop thereacross. The first switch biasing device 710 includes a fourth current source 714 coupled beneath the first resistor 712 and between the gate of NMOS transistor 707 of the first switching device 706 and the second supply voltage rail 104. The fourth current source 714, which could be realized by a NMOS transistor, biases the first switch biasing device 710 into operation.

The first switch 702 prevents the first booster device 508 from generating the first booster current 515 until the input voltage 105 approaches the upper limit $+V_{BB}-0.8$ V of the buffer voltage range 210. The first resistor 712 and npn transistor 711 of the first switch biasing device 710 sets the voltage at the gate of NMOS transistor 707 of the first switching device 706 to approximately one and one-half diode drops below the first supply voltage rail 102. The differential pair configuration prevents the first booster device 508 from turning on and supplying the first booster current 515 until the input voltage 105 at the gate of NMOS transistor 507 of the first booster device 508 meets or exceeds approximately one and one-half diode drops below the first supply voltage rail 102. In the preferred embodiment of the alternate output stage 700 of FIG. 7, the first booster device 508 turns on and supplies the first booster current 515 when the input voltage 105 at the gate of NMOS transistor 507 of the first booster device 508 exceeds approximately $+V_{BB}-1.2$ V. As the input voltage at the gate of NMOS transistor 507 of the first booster device 508 falls below approximately $V_{BB}-1.2$ V the first booster device 508 turns back off.

The second switch 704 includes a second switching device 716. The second switching device 716 includes PMOS transistor 717 coupled to the second booster device 510 in a differential pair configuration. PMOS transistor 717 of the second switching device 716 includes a gate, a drain coupled to the second supply voltage rail 104, and a source coupled to the source of PMOS transistor 509 of the second booster device 510. The second switching device 716 includes a fifth current source 718 coupled to the sources of PMOS transistors 509, 717 of the second booster device 510 and the second switching device 716, respectively, for biasing the differential pair configuration. The fifth current source 718 could be implemented by a PMOS transistor.

The second switch 704 includes a second switch biasing device 720 coupled to the second switching device 716. The second switch biasing device 720 includes pnp transistor 721 having a base, a collector, and an emitter coupled to the gate of PMOS transistor 717 of the second switching device 716. The base is coupled to the collector to realize a diode drop across pnp transistor 721. The second switch biasing device 720 includes a second resistor 722 coupled between the collector of pnp transistor 721 and the second supply voltage rail 104. The second resistor 722 is valued to provide approximately one-half of a diode drop thereacross. The second switch biasing device 720 includes a sixth current source 724 coupled between the first supply voltage rail 102 and the gate of PMOS transistor 717 of the second switching device 716. The sixth current source 724, which could be realized by a PMOS transistor, biases the second switch biasing device 720 into operation.

The second switch 704 prevents the second booster device 510 from generating the second booster current 516 until the input voltage 105 approaches the lower limit +0.8 V of the buffer voltage range 210. The second resistor 722 and pnp transistor 721 of the second switch biasing device 720 sets the voltage at the gate of PMOS transistor 717 of the second switching device 716 to approximately one and one-half diode drops above the second supply voltage rail 104. The differential pair configuration of the second switch 704 prevents the second booster device 510 from turning on and supplying the second booster current 516 until the input voltage 105 at the gate of PMOS transistor 509 of the second booster device 510 meets or goes below approximately one and one-half diode drops above the second supply voltage rail 104. In the preferred embodiment of the alternate output stage 700 of FIG. 7, the second booster device 510 turns on and supplies the second booster current 516 when the input voltage 105 at the gate of the PMOS transistor of the second booster device 508 falls below approximately 1.2 V. As the input voltage at the gate of PMOS transistor 509 of the second booster device 510 exceeds approximately 1.2 V, the second booster device 510 turns back off.

Figure 8:
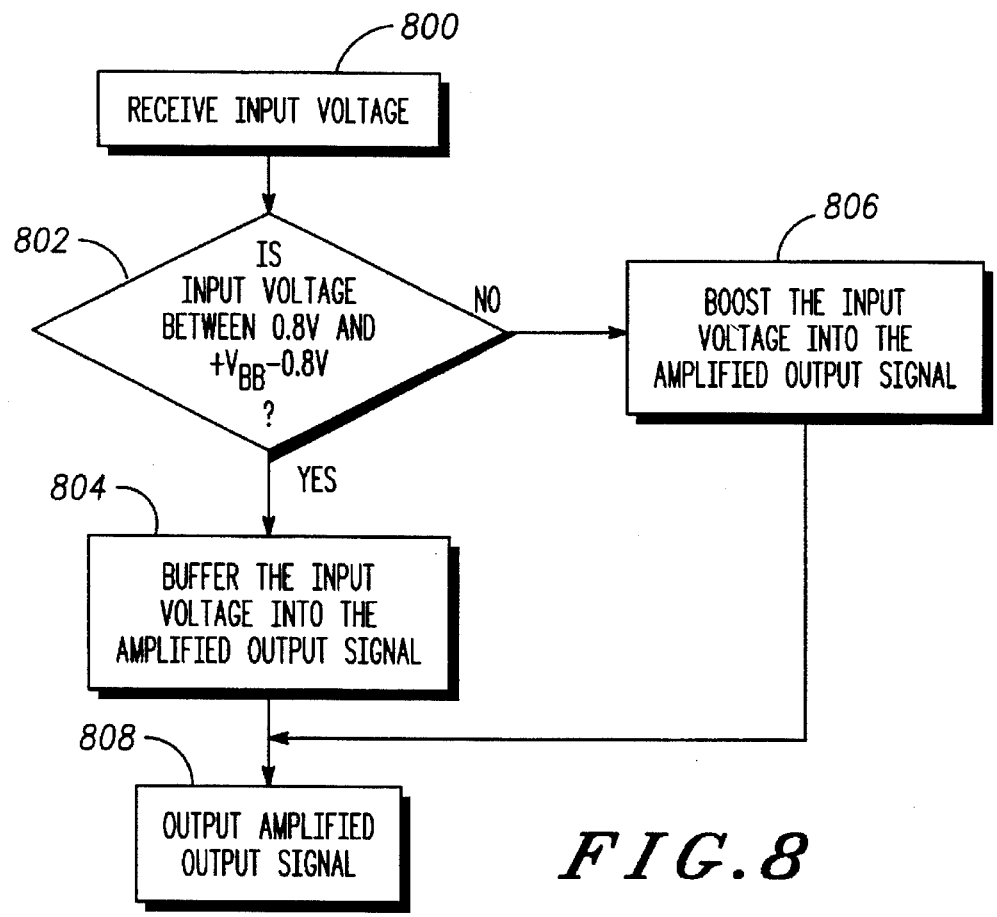
FIG. 8 is an illustration in flow chart form of a method of amplifying an input voltage.

FIG. 8 is an illustration in flow chart form of a method of amplifying the input voltage 105 into the output voltage 520 and output current 117 (collectively, the output signal) for driving a load coupled to an op amp output stage, such as output stage 418 or 700. Initially, at step 800, the input voltage 105 is received at the input 106 of the output stage 418, 700 depicted in FIGS. 5 and 7. If the input voltage 105 is within the buffer voltage range 210 (see FIG. 6) of 0.8 V to $+V_{BB}-0.8$ V, as determined at decision step 802, the output signal is generated primarily by the first and second buffering devices 108, 110 of the buffer 100 at step 804 and then output to the output 116 at step 808. The npn transistor 501 of the first buffering device 108 sources current to the output 116 when the input voltage 105 is between approximately $V_{BB}/2$ and approximately $+V_{BB}-0.8$ V. The pnp transistor 504 of the second buffering device 110 sinks current from the output 116 when the input voltage 105 is between approximately $+V_{BB}/2$ and approximately 0.8 V.

If the input voltage 105 is not within the buffer voltage range 210 of 0.8 V to $+V_{BB}-0.8$ V, as determined at decision step 802, the output signal is generated primarily by the first and second booster devices 508, 510 of the current booster 500 at step 806 and then output to the output 116 at step 808. NMOS transistor 507 provides the first booster current 515 when the input voltage 105 is between approximately $+V_{BB}-0.8$ V and approximately $+V_{BB}-0.2$ V. PMOS transistor 509 provides the second booster current 516 when the input voltage 105 is between approximately 0.2 V and approximately 0.8 V.

Although depicted as a bicmos implementation, it will be recognized that the current booster 500 and the first and second switching devices 702, 704 could be implemented in any complimentary linear IC technology, such as conventional CMOS or bipolar. Also, while shown as implemented with bipolar devices, the buffer 100 could be implemented using any complimentary technology, such as conventional CMOS.

In summary, an output stage for an operational amplifier powered by a first and second supply voltage rail and including a buffer portion and a booster portion provides low output impedance while also being able to approximately swing rail-to-rail. The buffer portion includes a first and second buffering transistor, each having a base coupled to an input of the output stage and an emitter coupled to an output of the output stage for providing a low impedance output. The first and second buffering transistors are biased into operation by a first and second biasing device, respectively. Due to the electrical characteristics of the first and second buffering transistors, the buffer portion is limited to producing a load driving output signal when the input voltage is at least a diode drop away from either the first or the second supply voltage rail. By coupling the booster portion between the input and the output, the output stage is able to deliver the load driving output signal for input voltages within a diode drop of either the first or second supply voltage rails. The booster portion includes a first booster transistor that supplies a first booster current to the output to provide the load driving output signal when the input voltage is within a diode drop of the first supply voltage rail. A second booster transistor of the booster portion supplies a second booster current to the output to provide the load driving output signal when the input voltage is within a diode drop of the second supply voltage rail. The first and second biasing transistors ensure that at least one of the first and second buffering transistors remain on while the first and second booster transistors provide the first and second booster currents, thus, ensuring a low impedance output.

We claim:

1. An output stage of an operational amplifier for use in a low voltage application, the output stage comprising:

a first supply voltage rail and a second supply voltage rail connected to a source of power to feed the output stage, a voltage difference in the first supply voltage rail and the second supply voltage rail defining a maximum voltage range;

an input to receive an input voltage;

a low impedance output to provide an amplified output signal having a voltage level and a current level;

a buffer comprising a transistor circuit coupled between the input and the output to supply a voltage level of the amplified output signal and a current level of the amplified output signal when the input voltage is within a buffer voltage range, the buffer voltage range contained entirely within the maximum voltage range; and a switchable current booster comprising a transistor circuit coupled between the input and the output to selectively add current to the buffer and enable the buffer to supply a voltage level of the amplified output signal that is outside of the buffer voltage range when the input voltage is outside of the buffer voltage range but within the maximum voltage range thereby providing substantial rail-to-rail swing for the output stage.

2. The output stage according to claim 1 further comprising:

a switch coupled to the switchable current booster for turning off the switchable current booster to minimize current drain when the input voltage is within the buffer voltage range and for turning on the switchable current booster when the input voltage is outside of the buffer voltage range.

3. The output stage according to claim 1 wherein the buffer is a push-pull circuit having a first buffering device and a second buffering device, the first buffering device to provide the voltage level and the current level of the amplified output signal when the input voltage is within the buffer voltage range and approaching the first supply voltage rail, the second buffering device operating to provide the voltage level and the current level of the amplified output signal when the input voltage is within the buffer voltage range and approaching the second supply voltage rail.

4. The output stage according to claim 3 wherein the switchable current booster comprises a first swing device and a second swing device, the first swing device adding current to the second buffering device to provide the current level of the amplified output signal when the input voltage is outside of the buffer voltage range and approaching the first supply voltage rail, the second swing device adding current to the first buffering device to provide the amplified output signal when the input voltage is outside of the buffer voltage range and approaching the second supply voltage rail.

5. The output stage according to claim 1 wherein the switchable current booster comprises a first swing device and a second swing device, the first swing device adding current to the buffer to provide the current level of the amplified output signal when the input voltage is outside of the buffer voltage range and approaching the first supply voltage rail, and the second swing device adding current to the buffer to provide the current level of the amplified output signal when the input voltage is outside of the buffer voltage range and approaching the second supply voltage rail.

6. The output stage according to claim 1 wherein the buffer includes:

a first transistor comprising a first base, a first emitter, and a first collector, the first base coupled to the input, the first collector coupled to the first supply voltage rail, and the first emitter coupled to the output; and a second transistor comprising a second base, a second emitter, and a second collector, the second base coupled to the input, the second collector coupled to the second supply voltage rail, and the second emitter coupled to the output.

7. The output stage according to claim 6 wherein the buffer further includes:

a third transistor to bias the first transistor, the third transistor comprising a third base, a third collector, and a third emitter, the third base coupled to the input, the third collector coupled to the second supply voltage rail, the third emitter coupled to the first supply voltage rail and the first base of the first transistor; and a fourth transistor to bias the second transistor, the fourth transistor comprising a fourth base, a fourth collector, and a fourth emitter, the fourth base coupled to the input, the fourth collector coupled to the first supply voltage rail, the fourth emitter coupled to the second supply voltage rail and the second base of the second transistor.

8. The output stage according to claim 1 wherein the switchable current booster includes:

a first booster transistor having a first gate, a first source, and a first drain, the first gate coupled to the input, the first source coupled to the second supply voltage rail, and the first drain coupled to the buffer, the first booster transistor to provide a first tail current to the buffer when the input voltage is outside of the buffer voltage range and approaching the first supply voltage rail; and a second booster transistor having a second gate, a second source, and a a second drain, the second gate coupled to the input, the second source coupled to the first supply voltage rail, and the second drain coupled to the buffer, the second booster transistor to provide a second tail current to the buffer when the input voltage is outside of the buffer voltage range and approaching the second supply voltage rail.

9. The output stage according to claim 8 wherein the first booster transistor is a NMOS transistor.

10. The output stage according to claim 8 wherein the second booster transistor is a PMOS transistor.

11. The output stage according to claim 8 wherein the switchable current booster further includes:
a first current mirror coupled between the first drain of the first booster transistor and the buffer to invert the first tail current; and
a second current mirror coupled between the second drain of the second booster transistor and the buffer to invert the second tail current.

12. The output stage according to claim 8 wherein the switchable current booster further includes:
a switch coupled to the first booster transistor to turn on the first booster transistor when the input voltage is outside of the buffer voltage range and approaching the first supply voltage rail.

13. The output stage according to claim 8 wherein the switchable current booster further includes:
a switch coupled to the second booster transistor to turn on the second booster transistor when the input voltage is outside of the buffer voltage range and approaching the second supply voltage rail.

14. The output stage according to claim 13 wherein the switch includes:
a first switch transistor having a first collector, a first base, and a first emitter, the first collector coupled to the second supply voltage rail, the first base coupled to the first collector, and the first emitter coupled to the first supply voltage rail; and
a second switch transistor having a third gate, a third drain, and a third source, the third gate coupled to the first emitter of the first switch transistor, the third drain coupled to the second supply voltage rail, and the third source coupled to the first supply voltage rail and the second source of the second booster transistor.

15. The output stage according to claim 1 wherein the first supply voltage rail is approximately 3 V and the second supply voltage rail is ground.

16. The output stage according to claim 1 wherein the operational amplifier is disposed on a substrate for use in an integrated circuit.

17. The output stage according to claim 16 wherein the output of the output stage is coupled to another device external to the integrated circuit.

18. An output stage for an operational amplifier, the output stage comprising:
a first supply voltage rail and a second supply voltage rail connected to a source of power for operating the output stage, a voltage difference in the first supply voltage rail and the second supply voltage rail defining a maximum voltage range;
an input for receiving an input voltage;
an output for providing an amplified output signal;
a buffer coupled between the input and the output for amplifying the input voltage into the amplified output signal when the input voltage is within a buffer voltage range, the buffer voltage range contained within the maximum voltage range, the buffer comprising a first buffer transistor and a second buffer transistor, the first buffer transistor to provide the amplified output signal when the input voltage is within the buffer voltage range and approaching the first supply voltage rail, the first buffer transistor having a first base, a first emitter, and a first collector, the first base coupled to the input, the first collector coupled to the first supply voltage rail, and the first emitter coupled to the output, the second buffer transistor to provide the amplified output signal when the input voltage is within the buffer voltage range and approaching the second supply voltage rail, the second buffer transistor having a second base, a second emitter, and a second collector, the second base coupled to the input, the second collector coupled to the second supply voltage rail, and the second emitter coupled to the output; and
a current booster coupled between the input and the output for assisting the buffer in amplifying the input voltage into the amplified output signal when the input voltage is outside of the buffer voltage range but within the maximum voltage range, the current booster comprising a first booster transistor and a second booster transistor, the first booster transistor having a first gate, a first source, and a first drain, the first gate coupled to the input, the first source coupled to the second supply voltage rail, and the first drain coupled to the second emitter of the second buffer transistor, the first booster transistor providing a first tail current at the second emitter of the second buffer transistor for assisting the buffer to provide the amplified output signal when the input voltage is outside of the buffer voltage range and approaching the first supply voltage rail, the second booster transistor having a second gate, a second source, and a second drain, the second gate coupled to the input, the second source coupled to the first supply voltage rail, and the second drain coupled to the first emitter of the first buffer transistor, the second booster transistor providing a second tail current at the first emitter of the first buffer transistor for assisting the buffer to provide the amplified output signal when the input voltage is outside of the buffer voltage range and approaching the second supply voltage rail.

19. The output stage according to claim 18 wherein the current booster further includes:
a first current mirror coupled between the first drain of the first booster transistor and the second emitter of the second buffer transistor for inverting the first tail current; and
a second current mirror coupled between the second drain of the second booster transistor and the first buffer transistor for inverting the second tail current.

20. An output stage for an operational amplifier, the output stage comprising:
a first supply voltage rail and a second supply voltage rail connected to a source of power for operating the output stage, a voltage difference in the first supply voltage rail and the second supply voltage rail defining a maximum voltage range;
an input for receiving an input voltage;
an output for providing an amplified output signal;
a buffer coupled between the input and the output for amplifying the input voltage into the amplified output signal when the input voltage is within a buffer voltage range, the buffer voltage range contained within the maximum voltage range; and
a current booster coupled between the input and the output for assisting the buffer in amplifying the input voltage into the amplified output signal when the input voltage is outside of the buffer voltage range but within the maximum voltage range, the current booster comprising a first booster transistor, a second booster transistor, and a first switch, the first booster transistor having a first gate, a first source, and a first drain, the first gate coupled to the input, the first source coupled to the second supply voltage rail, and the first drain coupled to the buffer, the first booster transistor providing a first tail current to the buffer so as to provide the amplified output signal when the input voltage is outside of the buffer voltage range and approaching the first supply voltage rail, the second booster transistor having a second gate, a second source, and a second drain, the second gate coupled to the input, the second source coupled to the first supply voltage rail, and the second drain coupled to the buffer, the second booster transistor to provide a second tail current to the buffer so as to provide the amplified output signal when the input voltage is outside of the buffer voltage range and approaching the second supply voltage rail, the first switch coupled to the first booster transistor for turning on the first booster transistor when the input voltage is outside of the buffer voltage range and approaching the first supply voltage rail, the first switch comprising a first switch transistor and a second switch transistor, the first switch transistor having a first collector, a first base, and a first emitter, the first collector coupled to the first supply voltage rail, the first base coupled to the first collector, and the first emitter coupled to the second supply voltage rail the second switch transistor having a third gate, a third drain, and a third source, the third gate coupled to the first emitter, the third drain coupled to the first supply voltage rail, and the third source coupled to the second supply voltage rail and the first source of the first booster transistor.

21. A low voltage integrated circuit package including a substrate, the substrate comprising:
an operational amplifier circuit comprising:
a first supply voltage rail and a second supply voltage rail connected to a source of power to feed the operational amplifier circuit, a voltage difference in the first supply voltage rail and the second supply voltage rail defining a maximum voltage range;
an input to receive an input signal having an input voltage;
a low impedance output to provide an amplified output signal having a voltage level and a current level;
an input stage coupled to the input; and
an output stage coupled to the input stage and the output, the output stage comprising:
a low output impedance buffer to amplify the input signal into the amplified output signal when the input voltage of the input signal is within a buffer voltage range contained entirely within the maximum voltage range; and
a high output impedance current booster coupled to the buffer to enable the buffer to amplify the input signal into the amplified output signal having a voltage that is outside of the buffer voltage range when the input voltage of the input signal is outside of the buffer voltage range but within the maximum voltage range, thereby providing substantial rail-to-rail swing for the output stage.

22. An output stage of an operational amplifier comprising:
a first supply voltage rail and a second supply voltage rail connectable to a source of power for operating the output stage;
an input for receiving an input voltage;
an output for providing an amplified output signal;
a first biasing transistor having a base, a collector, and an emitter, the base coupled to the input, the collector coupled to the first supply voltage rail, and the emitter coupled to the second supply voltage rail;
a first buffer transistor having a base, a collector, and an emitter, the base coupled to the emitter of the first biasing transistor, the collector coupled to the second supply voltage rail, and the emitter coupled to the output;
a second biasing transistor having a base, a collector, and an emitter, the base coupled to the input, the collector coupled to the second supply voltage rail, and the emitter coupled to the first supply voltage rail;
a second buffer transistor having a base, a collector, and an emitter, the base coupled to the emitter of the second biasing transistor, the collector coupled to the first supply voltage rail, and the emitter coupled to the output;
a first booster transistor having a gate, a source, and a drain, the gate coupled to the input, the source coupled to the second supply voltage rail, and the drain coupled to the first buffer transistor;
a first transistor current mirror coupled between the drain of the first booster transistor and the emitter of the first buffer transistor;
a second booster transistor having a gate, a source, and a drain, the gate coupled to the input, the source coupled to the first supply voltage rail, and the drain coupled to the second buffer transistor; and
a second transistor current mirror coupled between the drain of the second booster transistor and the emitter of the second buffer transistor.

23. The output stage according to claim 22 further comprising:
a first switch transistor having a collector, a base, and an emitter, the collector coupled to the first supply voltage rail, the base coupled to the collector, and the emitter coupled to the second supply voltage rail; and
a second switch transistor having a gate, a drain, and a source, the gate coupled to the emitter of the first switch transistor, the drain coupled to the first supply voltage rail, and the source coupled to the second supply voltage rail and the source of the first booster transistor.

24. The output stage according to claim 22 further comprising:
a third switch transistor having a collector, a base, and an emitter, the collector coupled to the second supply voltage rail, the base coupled to the collector, and the emitter coupled to the first supply voltage rail; and
a fourth switch transistor having a gate, a drain, and a source, the gate coupled to the emitter of the third switch transistor, the drain coupled to the second supply voltage rail, and the source coupled to the first supply voltage rail and the source of the second booster transistor.

* * * * *